(12) United States Patent
Belle

(10) Patent No.: US 8,921,239 B2
(45) Date of Patent: Dec. 30, 2014

(54) PROCESS FOR RECYCLING A SUBSTRATE

(75) Inventor: Anne Laure Belle, Saint Martin d'heres (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/516,199

(22) PCT Filed: Dec. 15, 2009

(86) PCT No.: PCT/IB2009/007972
§ 371 (c)(1),
(2), (4) Date: Jun. 14, 2012

(87) PCT Pub. No.: WO2011/073716
PCT Pub. Date: Jun. 23, 2011

(65) Prior Publication Data
US 2012/0258554 A1 Oct. 11, 2012

(51) Int. Cl.
*H01L 21/00* (2006.01)
*H01L 21/762* (2006.01)

(52) U.S. Cl.
CPC .............................. *H01L 21/76251* (2013.01)
USPC .............................................. 438/795; 438/4

(58) Field of Classification Search
USPC .......................................................... 438/4
See application file for complete search history.

(56) References Cited

U.S. PATENT DOCUMENTS

| | | | | |
|---|---|---|---|---|
| 2002/0146893 | A1 | 10/2002 | Shimoda et al. | 438/458 |
| 2002/0182889 | A1* | 12/2002 | Solomon et al. | 438/778 |
| 2004/0023468 | A1 | 2/2004 | Ghyselen et al. | 438/455 |
| 2004/0110395 | A1 | 6/2004 | Ueda et al. | 438/795 |
| 2006/0073640 | A1* | 4/2006 | Hu et al. | 438/122 |
| 2006/0172508 | A1 | 8/2006 | Maleville et al. | |
| 2006/0286770 | A1* | 12/2006 | Ghyselen et al. | 438/458 |
| 2009/0191719 | A1* | 7/2009 | Dupont | 438/779 |
| 2009/0212333 | A1* | 8/2009 | Bernard et al. | 257/288 |
| 2010/0109102 | A1* | 5/2010 | Chen et al. | 257/417 |

FOREIGN PATENT DOCUMENTS

| | | |
|---|---|---|
| CN | 1199507 A | 11/1998 |
| EP | 0858110 A | 8/1998 |

(Continued)

OTHER PUBLICATIONS

International Search Report, PCT/IB2009/007972, mailed Sep. 16, 2010.

(Continued)

*Primary Examiner* — Charles Garber
*Assistant Examiner* — Brigitte Paterson
(74) *Attorney, Agent, or Firm* — TraskBritt

(57) ABSTRACT

A process for recycling a support substrate of a material substantially transparent to at least a wavelength of electromagnetic radiation. The process includes providing an initial substrate; forming an intermediate layer on a bonding face of the support substrate having an initial roughness, with the intermediate layer being of a material substantially transparent to at least a wavelength of electromagnetic radiation; forming an electromagnetic radiation absorbing layer either on the bonding face of the initial substrate or on the intermediate layer; bonding the initial substrate to the support substrate via the electromagnetic radiation absorbing layer; and irradiating the electromagnetic radiation absorbing layer through the support substrate and the intermediate layer to induce separation of the support substrate from the initial substrate.

18 Claims, 8 Drawing Sheets

(56) References Cited

FOREIGN PATENT DOCUMENTS

| | | |
|---|---|---|
| JP | 10-125929 | 5/1998 |
| JP | 11-074533 | 3/1999 |
| JP | 20050093988 | 4/2005 |
| JP | 2005-515150 A | 5/2005 |
| JP | 2012-195504 | 10/2012 |
| WO | WO 03/062507 A2 | 7/2003 |
| WO | WO 2006/116003 A2 | 11/2006 |

OTHER PUBLICATIONS

International Preliminary Report on Patentability for International Application No. PCT/IB2009/007972 dated Jun. 19, 2012, 6 pages.
International Written Opinion for International Application No. PCT/IB2009/007972 dated Sep. 16, 2010, 5 pages.
International Search Report for International Application No. PCT/IB2009/007972 dated Sep. 16, 2010, 4 pages.
Korean Office Action for Korean Application No. 10-2012-7018176 dated Feb. 25, 2014, 9 pages.

* cited by examiner

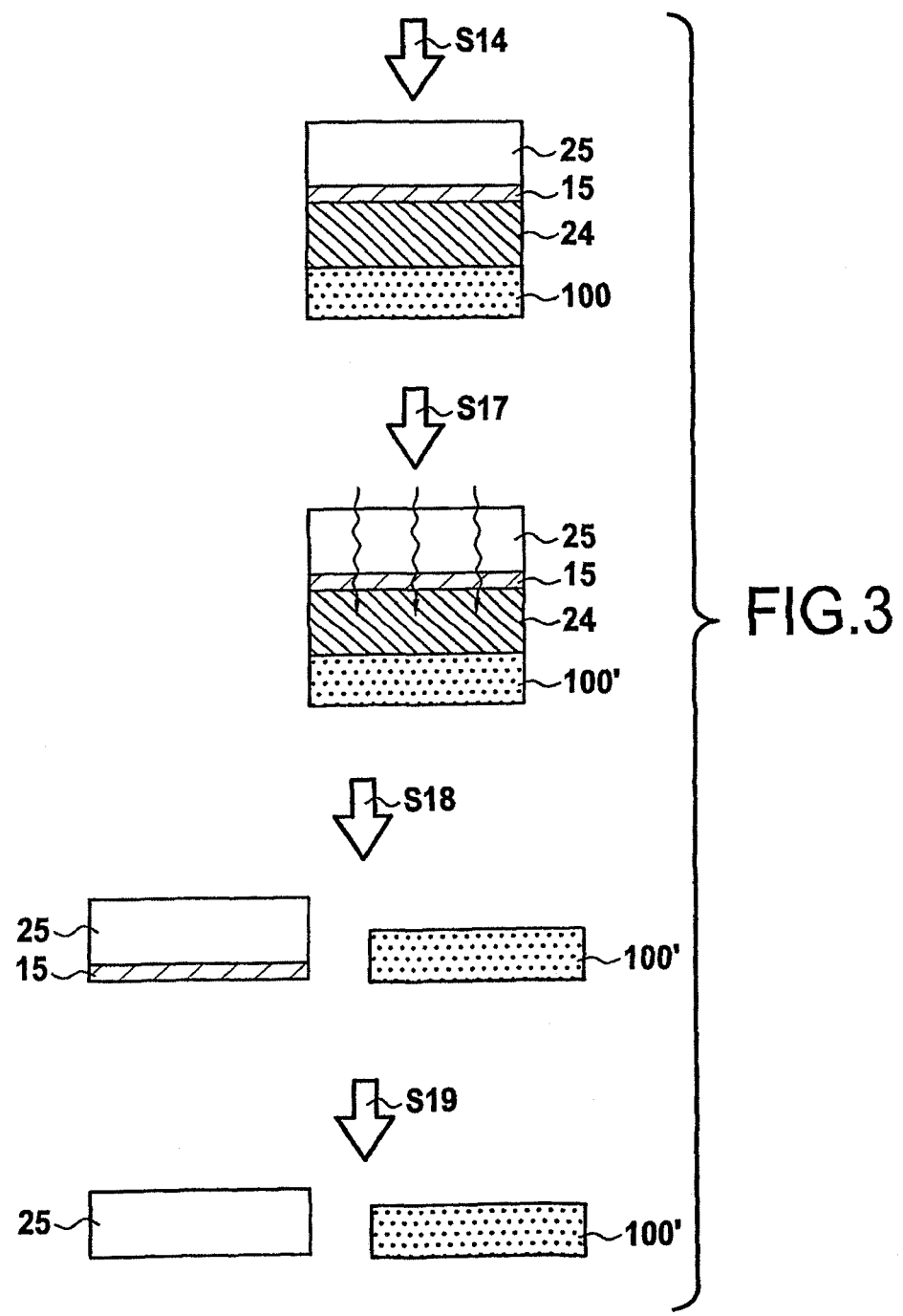

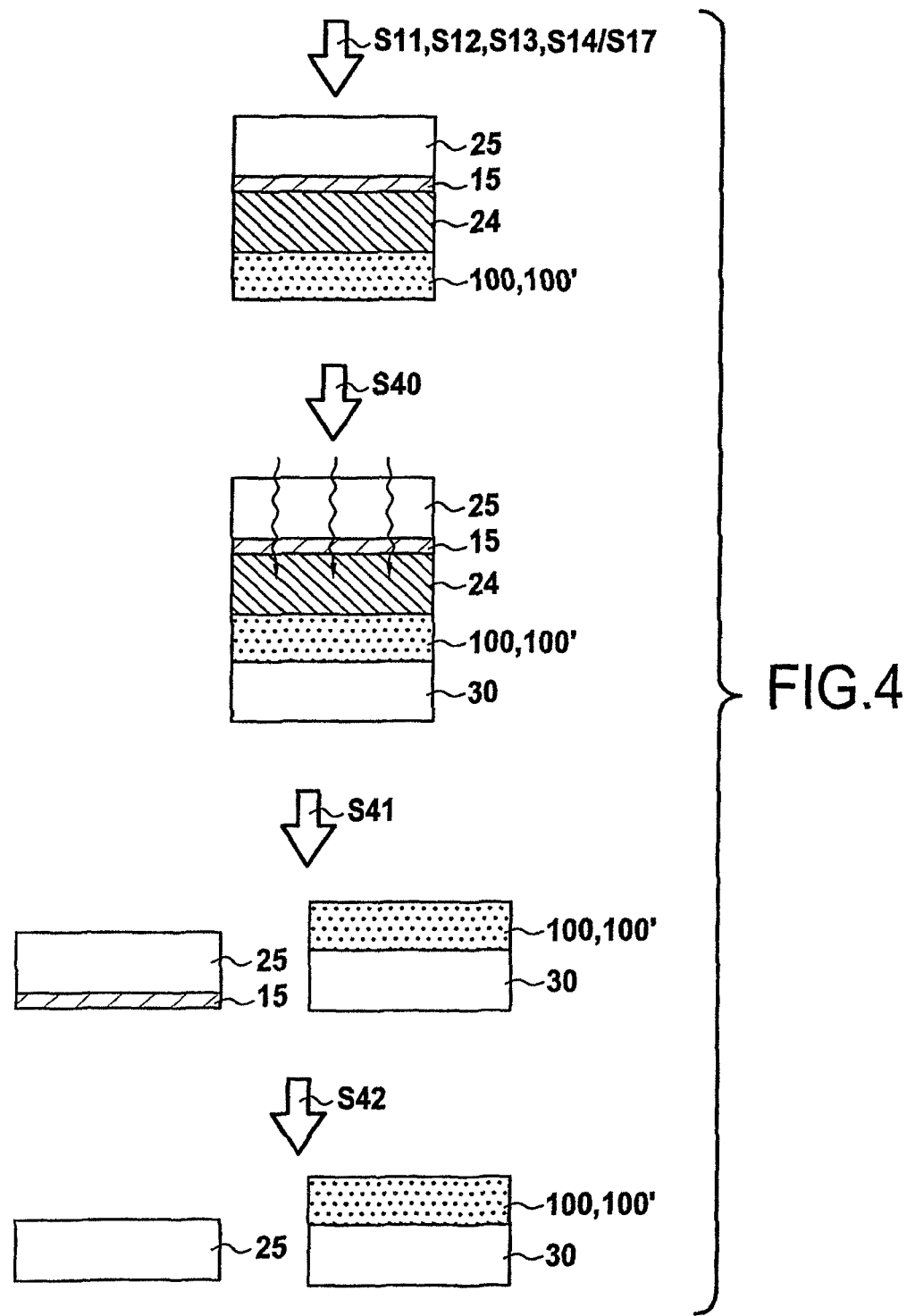

PROCESS FOR RECYCLING A SUBSTRATE

CROSS-REFERENCE TO RELATED APPLICATION

This is a national phase entry under 35 U.S.C. §371 filing of International Patent Application PCT/IB2009/007972, filed Dec. 15, 2009, designating the United States of America and published in English as International Patent Publication WO 2011/073716 A1 on Jun. 23, 2011.

TECHNICAL FIELD

The present invention relates to the field of semiconductor manufacture process wherein joining and separating layers and substrates are carried out, for example, for forming three-dimensionally stacked "system-on-chip" devices, or for transferring optoelectronic, (photo)voltaic and electronic elements. Materials of layers may, for example, be chosen among the IV group materials (Si, Ge . . . ), the III/V group materials (GaN, InGaN, InGaAs . . . ) and the materials can be polar, non-polar or semi-polar according to the application.

BACKGROUND

In the field of semiconductor manufacture, it is often useful or necessary in practice to join and/or remove films or layers of semiconducting or insulating material. On the one hand, it may be desired to prepare final stacked structures containing a three-dimensional design of electronic, photovoltaic and/or optoelectronic elements. On the other hand, thin films of high purity material and high crystalline quality may be appropriately handled on support substrates, and it is necessary to dispose of effective means for transferring these films from initial to final support substrates.

Moreover, some kinds of semiconducting materials may not be available as bulk or free-standing substrates and must be handled on support substrates, despite problems of lattice mismatch and/or thermal expansion coefficient that may arise. Methods are needed for removal of the functionalized semiconducting material layer from its support.

In the area of functionalized semiconductor layers, such as silicon layers for example, it is also useful to have available a method enabling layer transfer. Indeed, the functionalization of such semiconductor layers may involve electronic circuits, photovoltaic elements (containing, for example, a Ge seed layer, and a triple junction active layer), and/or optoelectronic elements. Being able to expose, manipulate and bond with relative ease both "front" and "back" faces of semiconductor layers enables functional elements to be introduced when the semiconductor layer treated is on a supporting substrate which allows a certain type of functional modification, and those functional elements to be occluded and then re-exposed as later required. Thus, electronic circuits may be introduced on one face of a thin layer on an initial support substrate favorable for this functionalization step, and then the exposed and functionalized "front" surface may be bonded to an intermediate substrate. The removal of the initial substrate support enables other circuits to be prepared on the "back" face of the functionalized thin layer. The exposed "back" face may be further transferred, for example, to a support adapted to the operation of the functionalized centers created, for example, for heat dissipation.

Furthermore, the group III-V materials such as InGaAs, InP or InAlAs are very useful for solar cell applications and III-nitride materials such as GaN, AlGaN or InGaN are of considerable interest in the semiconductor industry for use in light-emitting devices such as light-emitting diodes, laser diodes and related devices. GaN is a promising material for optoelectronic applications as well as for high frequency, high power electronic devices. It is important to be able to provide GaN or InGaN layers showing a low amount of crystal defects and a high quality surface.

It is of interest in these areas of technology to dispose of methods enabling III-V and III-N materials to be provided on a variety of surfaces and support materials. In techniques in which the III-V material is grown by epitaxy on a substrate surface, a high crystalline quality and appropriate lattice parameters of the growth substrate are necessary to enable sufficient quality III-V growth, restricting the choice of underlying seed support substrates for the III-V material.

In systems where it is foreseen to access the III-V layer by etching techniques, this may prove problematic and lead to degradation of the III-V material.

It is also of interest to be able to expose particular faces of III-N substrates. In effect, it is common for polar c-plane III-N material to have a specific atom surface termination such that one surface is terminated by the element from group III and the other surface is terminated by nitrogen atoms.

In all the above-related cases, methods for detaching or exfoliating thin films or layers, or a stack of them, from a substrate are needed. Moreover, there is also a need for performing such a detachment or exfoliation without destroying the substrate in order to recycle it for subsequent uses.

Document EP 0 858 110 discloses an exfoliating method for exfoliating a detached member, which is present on a transparent substrate with a separation layer therebetween, from the substrate, wherein the separation layer is irradiated through the transparent substrate with incident light so as to cause exfoliation in the separation layer and/or at the interface, and to detach the detached member from the substrate.

However, when irradiating the separation layer with a laser beam through a transparent substrate, made of sapphire ($Al_2O_3$), for instance, an undesired topology or defects are produced on the surface of the substrate on which the separation layer is formed. This surface topology can be of 30 nm.

In order to make the substrate reusable after irradiation and exfoliation, this surface topology must be removed. In view of the level of the surface topology, a significant thickness of the substrate must be removed, for instance, by polishing, after each irradiation and exfoliation. This considerably limits the recycling capacity of the substrate.

Moreover, the polishing of transparent substrates, such as sapphire or silicon carbide substrates, is generally long and expensive due to the hardness of the material of the substrates.

SUMMARY OF THE INVENTION

With a view to solving the problems set out above, the present invention proposes a process for recycling a support substrate of a material substantially transparent to at least a wavelength of electromagnetic radiation, the process comprising:

providing an initial substrate;

forming an intermediate layer on a face of the support substrate, the intermediate layer being of a material substantially transparent to at least a wavelength of electromagnetic radiation;

forming an electromagnetic radiation absorbing layer either on the bonding face of the initial substrate, and/or on the intermediate layer;

bonding the initial substrate to the support substrate via the electromagnetic radiation absorbing layer; and carrying out irradiation of the electromagnetic radiation absorbing layer through the support substrate and the intermediate layer to induce separation of the support substrate from the initial substrate.

Thanks to the presence of an intermediate layer between the support substrate and the electromagnetic radiation absorbing layer, the electromagnetic radiation does no longer hit the electromagnetic radiation absorbing layer immediately at the surface of the support substrate but at the surface of the intermediate layer. Thus, the excessive amount of energy that may occur at the interface between the transparent support substrate, and the absorbing layer now takes place at the interface between the intermediate layer and the absorbing layer, namely at a place sufficiently distant from the support substrate to avoid production of surface topology on the surface of the support substrate. The presence of a surface topology on the intermediate layer is of less importance since this layer is removed after irradiation.

According to the process of the invention, even after carrying out irradiation through the support substrate and the intermediate layer to induce separation of the support substrate from the initial substrate, the roughness on the bonding face of the support substrate is not modified. Indeed, the process may further comprise, after the step of carrying out irradiation, a step of removing the intermediate layer to recover the support substrate. After this removing step, the bonding face of the support substrate presents a roughness substantially similar to its initial roughness. Therefore, the support substrate may be reused as such without any particular preparation steps.

BRIEF DESCRIPTION OF FIGURES

FIGS. 3 and 4 represent schematic views of example processes of the invention in which, respectively, the new layer of FIG. 2 is functionalized to produce a functionalized layer, and/or further layers are bonded to the new layer;

DETAILED DESCRIPTION

Figure 1:
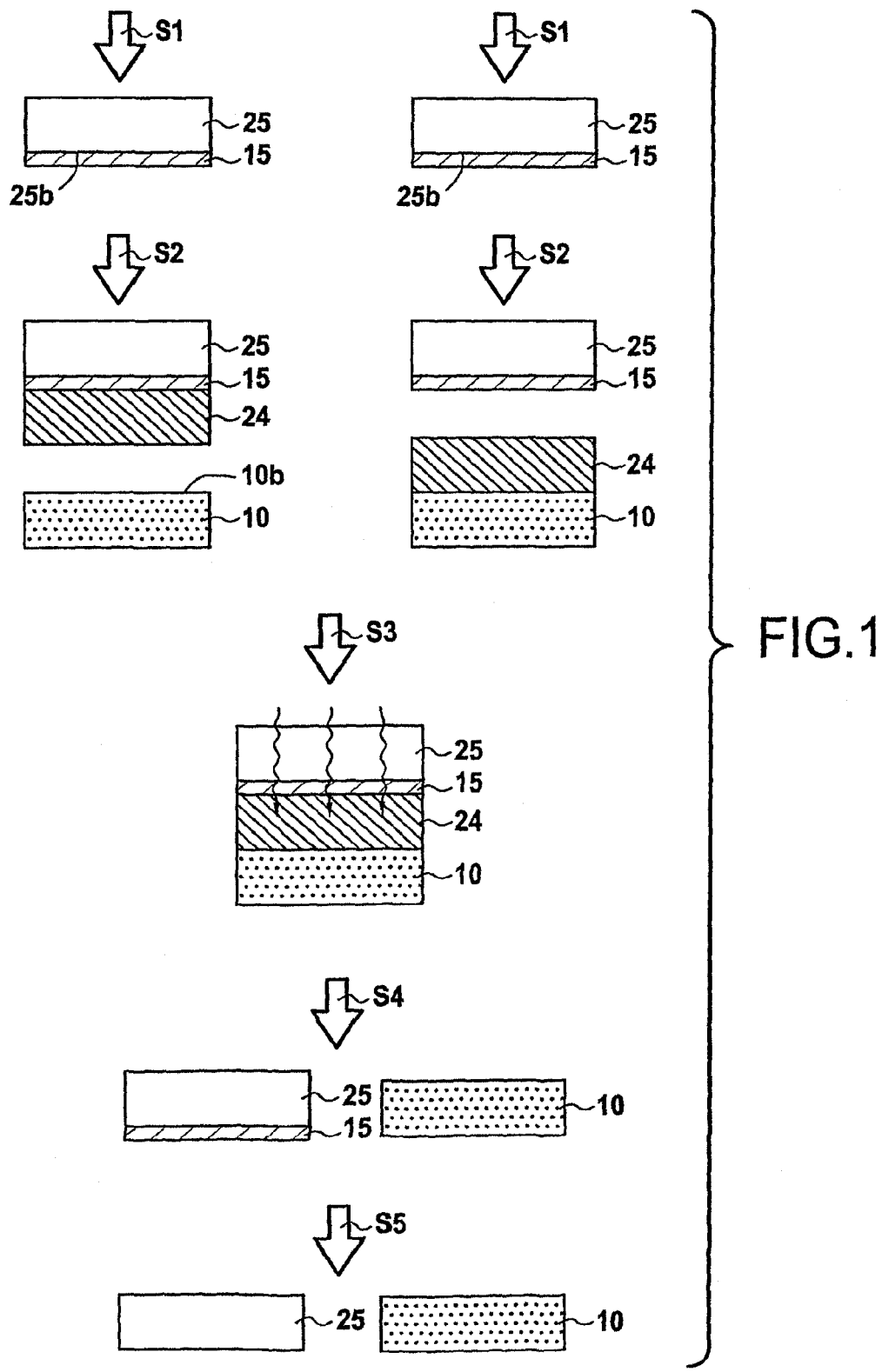
FIG. 1 represents a schematic view of the general process of the invention.

FIG. 1 represents a schematic view of the general process of the invention.

As shown in FIG. 1, the invention includes a step of forming an intermediate layer 15 on a bonding face 25b of a support substrate 25 (S1 in FIG. 1), a step S2 of forming an electromagnetic radiation absorbing layer 24 either on a bonding face 10b of an initial substrate 10, and/or on the intermediate layer 15, a bonding step S3, a step S4 of irradiation of the bonded entity with electromagnetic radiation, such as visible light and/or ultraviolet radiation, and a step S5 of removing the intermediate layer 15 from the support substrate 25.

The bonding of layers may involve molecular, eutectic, hot, pressured or anodic bonding. As an example, bonding may be achieved using one or more oxide bonding layers (not shown in FIG. 1), that may be added to one or both of the faces of substrates being bonded. An appropriate example of a material for an oxide bonding layer is silicon dioxide ($SiO_2$). Silicon dioxide materials for bonding purposes may be provided in layers thermally or by chemical vapor chemical deposition techniques such as LPCVD or PECVD.

In contrast, the use of adhesive layers to perform the bonding is not possible. The adhesive would not support the temperature at which the structure is submitted during subsequent steps of the process such as epitaxy or other functionalizing steps.

Concerning the electromagnetic radiation absorbing layer 24, the composition of this layer is chosen in such a way as to absorb electromagnetic radiation emitted by a source such as a laser at a chosen wavelength and allow the separation of bonded entity under the effect of the energy absorbed. Thus, in general, in the process of modifying a substrate 10 in the present invention, the separation of the support substrate 25 is due to chemical and/or physical changes in the electromagnetic radiation absorbing layer 24.

By "separation of the bonded entity" it is meant that the binding energy of each element forming the bonded entity is weaker after the application of the electromagnetic radiation than before. The actual detachment of the elements from each other, if this result is indeed desired, may require application of additional energy such as mechanical efforts.

According to the nature of the absorbing layer, the energy absorbed will give rise to different effects, for example, atomic level vibration, sublimation, specific diffusion or formation of a gas, which in itself leads to separation, as defined above, or chemical reactions. Mechanisms involving purely thermal effects as well as photochemistry can thus be behind the separation mechanism.

In the process of the present invention, the absorbing layer 24 may appropriately comprise at least one material selected from the group consisting of: $Si_xN_y$:H, $Si_3N_4$, $Si_xN_y$, GaN, AlN, InN, or mixed nitrides of one or more of In, Ga and Al or poly Si, or single-crystalline Si. The absorbing layer may also comprise amorphous silicon doped with hydrogen by ion implantation, for instance. The hydrogen content is preferably of at least 2 atomic percent.

In a variant, several absorbing layers 24 may be introduced and buried in the bonding layer so that several irradiations for several subsequent separations may be performed.

Any type of electromagnetic radiation, which causes internal and/or interfacial exfoliation of electromagnetic radiation absorbing layer 24, can be used, for example, X-rays, ultraviolet rays, visible rays, infrared rays (heat rays), laser beams, milli-waves, microwaves, and radiations (gamma rays). Among them, laser beams are preferable because they can easily cause exfoliation (ablation) of the electromagnetic radiation absorbing layer.

Examples of lasers generating the laser beams include gas lasers and solid lasers (semiconductor lasers), and excimer lasers, Nd-YAG lasers, Ar lasers, $CO_2$ lasers, CO lasers, and He—Ne lasers may be preferably used. Among them excimer lasers are more preferably used. The excimer laser is a gas laser that is capable of outputting laser light with high energy, and four typical types of laser light can be output (XeF=351 nm, XeCl=308 nm, KrF=248 nm, ArF=193 nm) by combinations of rare gases (Ar, Kr, and Xe) and halogen gases (F2 and HCl) as laser media.

Laser irradiation is preferably carried out in the framework of the present invention across the support substrate 25 and the intermediate layer 15. The latter support substrate 25 and intermediate layer 15 must therefore be substantially transparent to the wavelength of visible light and/or ultraviolet radiation being used to effect the separation mechanism, that is, the material of the support substrate has a weak optical absorption coefficient at the wavelength used, for example, less than about $10^1$ cm$^{-1}$, or has a transmission optical band that is larger than that of the material of the absorbing layer 24. The absorbing layer 24 may appropriately be a material of the type $Si_xN_y$:H, $Si_3N_4$ in amorphous form, $Si_xN_y$, or a III-N material deposited, for example, in a polycrystalline form (the latter being less expensive in an industrial context than a monocrystalline form). These materials enable irradiation to be carried out at a wavelength that remains above the absorption wavelength of typical support materials. Another appropriate possibility within the present invention is to use a III-N material as the layer 24 absorbing electromagnetic radiation such as visible light and/or ultraviolet radiation. If a substrate such as initial substrate 10 is itself a III-N material that is to be processed so as to introduce functionalities, the use of the same III-N material layer as an absorbing layer 24 will preferably be carried out with the two III-N layers (functionalized layer and sacrificial electromagnetic radiation absorbing layer) being separated by a bonding layer, such as a silicon dioxide bonding layer. Among III-N materials that can be used as absorbing layers, one may cite GaN (with a wavelength of absorption below 360 nm in view of the forbidden band of 3.4 eV), AlN (below 198 nm in view of the forbidden band of 6.2 eV), InN (below 230 nm in view of the forbidden band at 0.7 eV). An Nd/YAG or excimer laser may be used to induce decomposition or other effects of such an electromagnetic radiation absorbing layer 24 that could lead to separation.

Ternary or quaternary nitride materials combining aluminium, gallium and indium may also be used as materials for an electromagnetic radiation absorbing layer 24, for example, AlGaN or InGaN. These nitride materials are particularly useful because they seem to decompose with production of gaseous nitrogen. Their forbidden band defines a clear threshold of wavelength absorption, at which point the materials show a transition from almost complete transparency to almost complete absorption. Furthermore, their melting point is much higher than the temperature at which they decompose and they give rise to minimum collateral damage to the surrounding substrate when melting.

In order to enable the separation mechanism to operate, it is necessary that support substrate 25 and intermediate layer 15 be substantially transparent or has a high transmittance to the electromagnetic radiation such as ultraviolet and/or visible light in the wavelength region which will be used to irradiate the absorbing layer 24. The preferred minimum thickness of the absorbing layer 24 is 10 nm. When depositing the absorbing layer 24, care is taken to avoid forming layer(s) on both sides of the support substrate 25. Indeed an absorbing layer also formed on the back side of the support substrate 25 may completely absorb irradiation, interfere with the absorption of the buried absorbing layer 24 and may block the separation step.

The use of sapphire ($Al_2O_3$) is an appropriate choice for support substrate 25, because high transmittance is observed at wavelengths higher than 350 nm which corresponds to commonly used laser sources. Sapphire is also appropriate for shorter wavelengths, such as, for example, wavelengths lying in range from approximately 100 nm to 350 nm. Other appropriate choices for support substrate 25 include materials made of at least one of the following species: $LiTaO_3$ (substantially transparent at wavelengths higher than 270 nm), $LiNbO_3$ (substantially transparent at wavelengths higher than 280 nm), MgO (substantially transparent at wavelengths higher than 200 nm), $CaF_2$, $MgF_2$ or glass. Other materials may also be suitable to obtain the separation, even if they do not exhibit the same high transmittance value as the one listed above, but may then require higher electromagnetic radiation energy, which is not desirable in an industrial environment.

The intermediate layer 15 comprises a material substantially transparent to the wavelength of electromagnetic radiation used for irradiating the absorbing layer 24. The material of the intermediate layer is notably selected from the materials transparent to wavelengths lying from 100 nm to 1200 nm corresponding to the wavelengths of most laser beams commonly used.

The intermediate layer 15 is also preferably made with a material that can be removed easily, in particular by chemical etching or by polishing, and exhibits thermal insulation properties, such as, for example, $SiO_2$, or doped SiO2 with B and/or P, SiN, LIF, $CaF_2$ and $MgF_2$.

However, when the support substrate 25 comprises a glass substrate such as a boron-doped silica glass, the intermediate layer 25 is preferably made of a vitreous material such as boron-doped silica glass that is removed by mechanical or chemical-mechanical polishing. The intermediate layer 15 preferably contains a higher concentration of boron than the support substrate 25 so that the etching rate of the intermediate layer 15 is higher than the one of the support substrate 25 (ratio of 10/1, for example) and allows selective etching.

The thickness of the intermediate layer is at least 10 nm and preferably at least 50 nm. More generally, the thickness of the intermediate layer may be comprised, for instance, between 10 nm and 500 nm.

In order to avoid too large loss of the incident light (electromagnetic radiation), which would require using a large amount of light, it is preferable that the material of the intermediate layer has a transmittance of at least 90% with respect to the wavelength of the incident light.

The intermediate layer 15 may be notably made of silicon dioxide ($SiO_2$). In view of the thickness of the intermediate layer 15 of the invention, generally lower than 1 μm, $SiO_2$ is transparent to a large wavelength of electromagnetic radiation. $SiO_2$ has a transmittance of 90% or more with respect to wavelengths from 100 nm and more which correspond to the wavelengths of most laser beams commonly used.

In the step S5, the intermediate layer 15 may be eliminated from the support substrate 25 with any technique suitable for removing the material of the intermediate layer. Chemical etching or polishing, which is a relatively cost effective technique, is preferably used for removing the intermediate layer.

Regarding the materials of the support substrate 25 and the intermediate layer 15, one skilled in the art preferably chooses materials facilitating a selective removing of the intermediate layer 15 from the support substrate 25. For example, the material of the intermediate layer 15 is preferably chosen as having an etching rate and/or a polishing rate greater than the material of the support substrate 25. The materials of the intermediate layer 15 and support substrate 25 may also be of the same chemical nature but with a different crystallography so that one of the materiala, namely that of the support substrate 25, is harder to polish than the other, namely that of the intermediate layer 15. In that case, the detection of the interface between the intermediate layer 15 and the support substrate 25 is performed by detection of variation of the polishing rate.

As explained previously, thanks to the presence of the intermediate layer on the bonding face of the support substrate, the latter exhibits a roughness that is similar to its initial roughness before the steps S1 to S5. Therefore, after step S5, the support substrate is recovered in a state, at least in terms of surface roughness, wherein it can be reused as such. The process of the invention thus also includes one or several further steps of using the recovered support substrate after removing the intermediate layer as in step S5. The substrate thus recovered may be notably used for epitaxial growth, bonding with another substrate, or repeating the steps S1 to S5 as described above, and without particular additional preparation treatments.

In a preferred embodiment according to the invention, in the process for recycling a support substrate 25 according to the invention, a part of the initial substrate 10 is removed to form a layer 100, preferably before the step of irradiating the electromagnetic radiation absorbing layer 24. According to the invention, the layer 100 may alternatively consist on a single layer of one material or a plurality (stack) of sub-layers of different materials (some sub-layers may be of the same material). An example of such a process is illustrated schematically in FIG. 2, where initial substrate 10, in this example after the step S11 of forming an intermediate layer 15 on a bonding face 25b of a support substrate 25, the step S12 of forming an electromagnetic radiation absorbing layer 24 either on the bonding face 10b of the initial substrate 10, and/or on the intermediate layer 15, and the bonding step S13, is partially thinned or ablated by a method such as grinding, polishing, SMARTCUT®, by a laser lift-off technique or etching, to give rise to modified layer 100 derived from initial substrate 10 (step S14). A step of irradiation S15 of the bonded entity with electromagnetic radiation, such as visible light and/or ultraviolet radiation, is then carried out to induce separation of the modified layer 100 from the support substrate 25. In a step S16, the intermediate layer 15 is removed from the support substrate 25.

Further preferred in the present invention is a process for recycling a substrate including such a step of removing part of the initial substrate to form a layer 100, and then, in a further step, after the bonding step in the above-mentioned process:
functionalizing the layer 100; and/or
bonding further layers to the layer 100.

These two further preferred embodiments are illustrated schematically in FIGS. 3 and 4.

Figure 2:
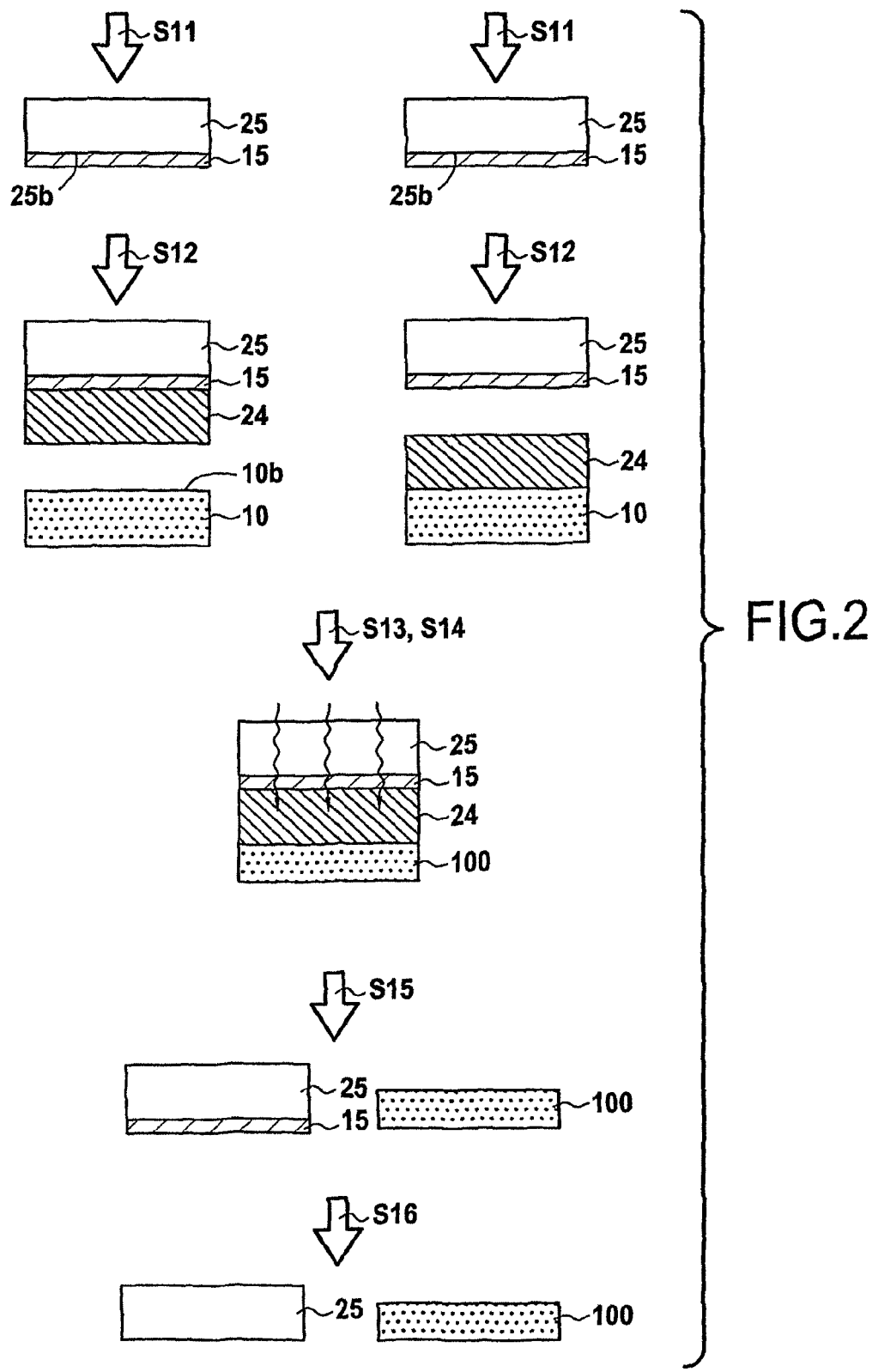
FIG. 2 represents a schematic view of an example process of the invention in which a part of an initial substrate is removed to form a new layer.

In FIG. 3, 100' represents a functionalized layer 100 (derived from the initial substrate 10). Functionalization step, shown in a schematic illustrative example in step S17 of FIG. 3 following on from steps S11 to S14 as shown in FIG. 2, may include forming regions with photovoltaic, optical, optoelectronic, electronic and/or mechanical functions in or on the layer 100. It is also to be understood that the functionalization step may include any technological step that changes the layer characteristic such as forming material layers, thin layers or sufficiently thick layers to be freestanding, or forming active layers by deposition, for example, deposition by epitaxy. A step of irradiation S18 of the bonded entity with electromagnetic radiation, such as visible light and/or ultraviolet radiation, is carried out to induce separation of the functionalized layer 100' from the support substrate 25. A step S19 of removing the intermediate layer 15 from the support substrate 25 is then carried out.

In FIG. 4, a further substrate 30 is bonded to the entity comprising layer 100, electromagnetic radiation absorbing layer 24 and support substrate 25 in a step S40, following on e.g., from steps S11 to S14 as shown in FIG. 2 or from step S17 in FIG. 3. In FIG. 4, the possibility that layer 100 may have been functionalized is indicated by the legend 100, 100'. It is also possible that support substrate 25, instead of or in addition to layer 100, contain regions with photovoltaic, optical, optoelectronic, electronic and/or mechanical functions. Bonding may be performed to join the exposed face of layer 100, derived from initial substrate 10, to a final substrate 30 that may also be functionalized. Bonding may, for example, be performed via a silicon dioxide bonding layer laid down by the processes discussed above. This bonding may also contain an electromagnetic radiation absorbing layer for a subsequent separation of support substrate 30 if needed.

A step of irradiation S41 of the bonded entity with electromagnetic radiation, such as visible light and/or ultraviolet radiation, is carried out to induce separation of the functionalized layer 100, 100' from the support substrate 25. A step S42 of removing the intermediate layer 15 from the support substrate 25 is then carried out.

In one embodiment according to the process of the present invention, the initial substrate 10 may be a bulk free-standing substrate.

In one embodiment, the initial substrate 10 may comprise a surface layer 12 having a face 12b for bonding to the support substrate 25, and an underlying support substrate 11 acting as a template on which surface layer 12 has been deposited. In such systems, the surface layer 12 and bulk substrate 10 from which layer 100 is formed may appropriately comprise at least one of the group selected from: GaN, InGaN, SiC, Si, Si(000), Si(111), GaAs, ZnO, crystalline AlN, AlGaN, InGaAs, InP, Ge, InAlAs, which are preferably single crystal materials. The layer 100 may also be formed in at least one semiconductor material, preferably a single crystal material, for example, from the IV group materials (such as Si, Ge), the III/V group materials (polar or non-polar or semi-polar materials such as GaN, InGaN, InGaAs).

The initial substrate 10 to be used in the process of the present invention may appropriately contain an underlying support substrate 11 chosen for a reasonable dilatation coefficient match and/or lattice parameter match between the support and the surface layer 12 comprising sapphire ($Al_2O_3$), $LiTaO_3$, $LiNbO_3$, MgO, Si, SiC or a metal alloy containing one or more of Cr, Ni, Mo and W. Such materials may also be used in the final substrate (30), in embodiments where there is such a final substrate.

In the case where the initial substrate 10 comprises a surface layer 12 grown on an underlying support substrate 11, it is preferable to ensure a reasonable lattice match between initial seed support substrate 11 and the surface layer 12, from which the layer 100, in which functionalities are to be introduced, is formed. As an example, where the surface layer 12 is a III-N material, appropriate initial seed support materials may, for example, include: sapphire ($Al_2O_3$), SIC, Si(111), GaAs, ZnO, crystalline AlN.

In a preferred process embodiment according to the present invention, in the framework of a process including thinning of initial substrate 10 to produce layer 100, epitaxy as a step of functionalization may be carried out on layer 100, for example, to obtain a sufficient thickness of material for the layer then produced to become a free standing substrate.

In a further preferred embodiment, ion implantation is performed in said initial substrate 10, prior to bonding to the support substrate 25 via the radiation absorbing layer 24, so as to provide a plane of weakness defining an upper region of substrate 10, and removing the upper region by splitting at the plane of weakness.

Figure 5A:
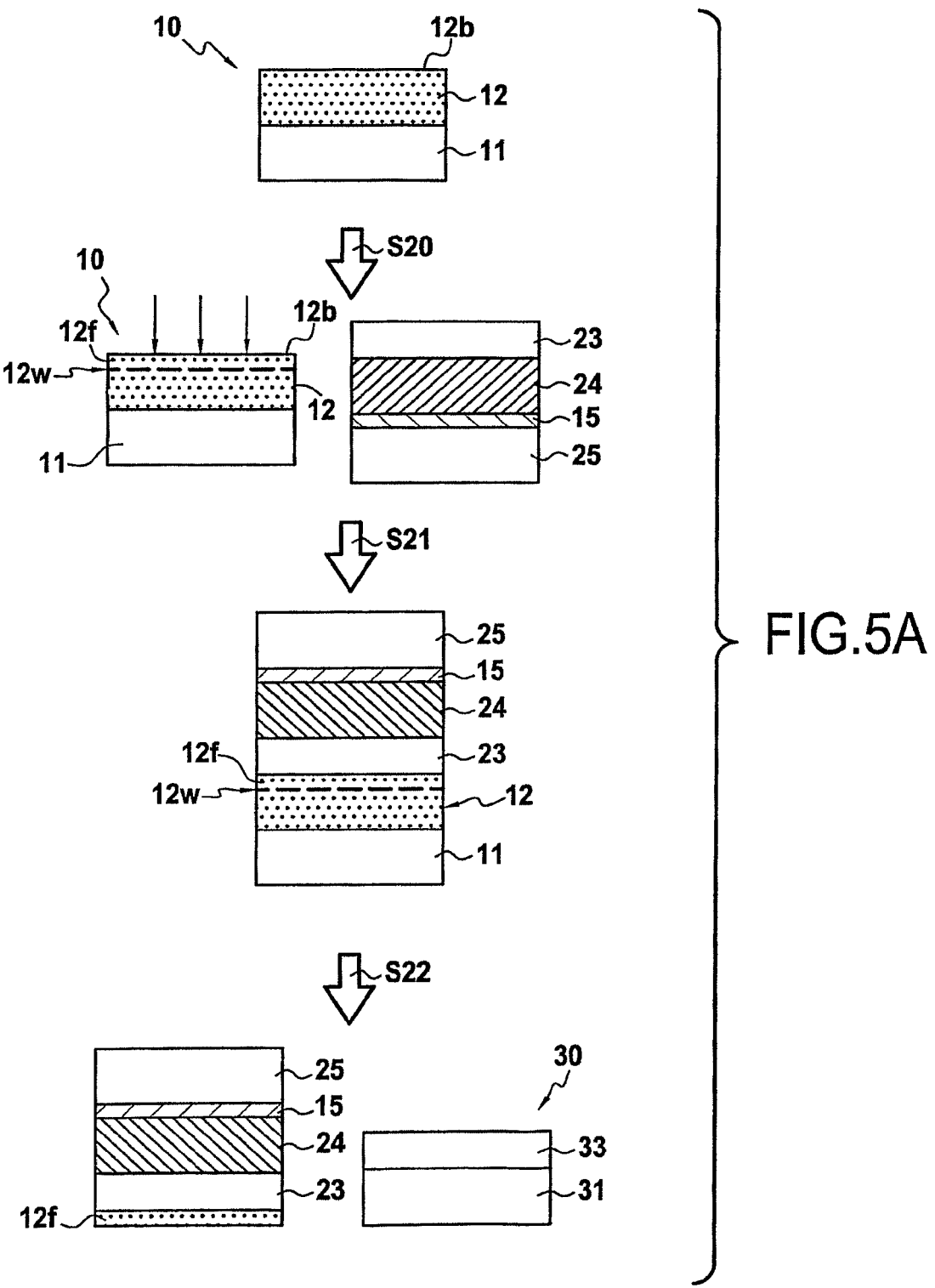
FIGS. 5A and 5B are schematic views of an example process of the invention in which ion implantation is used as well as bonding to a final substrate.
Figure 5B:
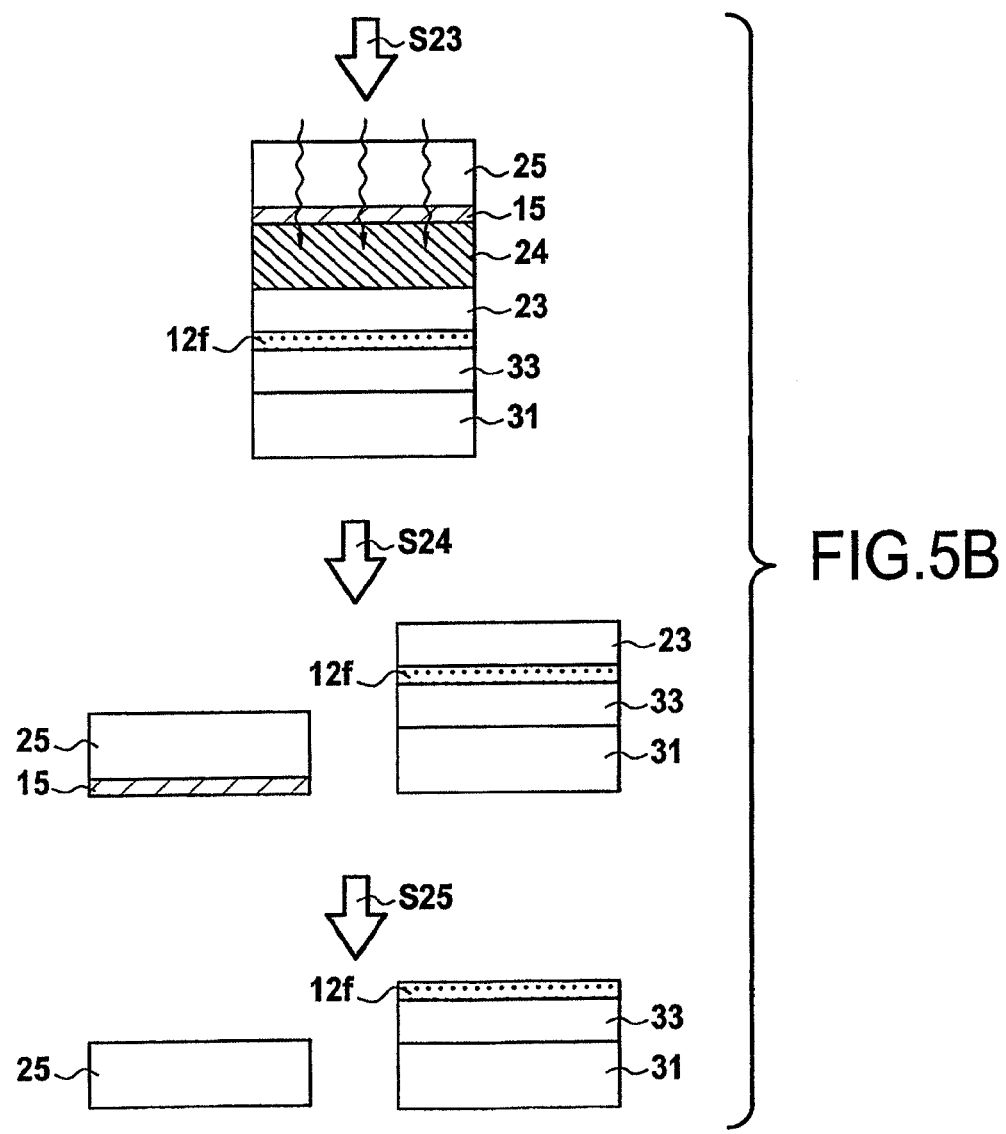

Thus, in a first preferred embodiment of the process according to the present invention, as is shown schematically in FIGS. 5A and 5B, a III-N material layer is withdrawn from an initial donor substrate using SMARTCUT® technology. Namely, the III-N material (12 in FIG. 5A) may be initially present on a bulk donor substrate. In an example of this, as shown in FIG. 1, a III-N material is shown that may be GaN grown by epitaxy on a "template" such as sapphire. An alternative embodiment would be to use a III-N material attached to a support substrate via an intermediate bonding layer; such an arrangement may be referred to as "GaNOS" (GaN bonded On Sapphire).

Ion implantation is carried out in layer 12 through a bonding layer 23a (step S20 in FIG. 5A), and then bonding (step S21 in FIG. 5A) is performed to a bonding layer 23b on a second substrate, linking the III-N layer 12 through a bonding material layer 23 to an electromagnetic radiation absorbing layer 24 on a support substrate 25 having an intermediate layer 15 formed on its surface according to the invention. The bonding may also be performed without the bonding material layer 23 directly between the support substrate 25, the absorbing layer 24 and the M-N material layer 12. Splitting (step S22 in FIG. 5A) at the plane of weakness 12w generated by ion implantation may then be achieved. In a manner known to one skilled in the art, implantation of hydrogen ions, co-implantation of hydrogen and helium ions, and more generally implantation of light ions, may be performed. A generally appropriate implantation dose of hydrogen ions for GaN lies between $1\times10^{17}$ and $6\times10^{17}$ atoms/cm$^2$, with an implantation energy range of 10 to 210 keV. Implantation may generally be performed at a temperature lying between 20° C. and 400° C., preferably between 50° C. and 150° C. The skilled person knows how to adjust the implantation so as to obtain a depth of the plane of weakness of between 50 and 1000 nm, and the temperature and duration of the heating process used to induce separation and splitting about the plane of weakness 12w are known to vary according to implantation conditions, and in particular the implantation ion dose.

In step S23 in FIG. 5B, the surface exposed by splitting about the plane of weakness 12w is bonded to a final substrate 30, in this case chosen to comprise a final support substrate 31 and a bonding layer 33. Subsequently, in step S24 in FIG. 5B, the entity thus obtained, containing elements from each of the initial, second and third substrates, is subjected to electromagnetic radiation, directed through transparent support substrate 25 and the intermediate layer 15, the radiation having a wavelength chosen so as to be absorbed by electromagnetic radiation absorbing layer 24 and to lead to the separation of substrate 25.

When the support substrate 25 is sapphire, the intermediate layer 15 is preferably an $SiO_2$ material and has a preferable thickness of at least 50 nm. Thus, the electromagnetic radiation may be performed at a wavelength of 193 nm at which both support substrate 25 and intermediate layer 15 are at least substantially transparent.

In a process such as shown schematically in FIG. 5A, epitaxial growth (not shown in FIG. 5B) may be performed on thin layer 12f so as to produce a substrate of sufficient thickness (for example, greater than 100 microns) to enable it to be freestanding, before fracturing about the plane of weakness 12w. Epitaxial growth may thus be performed before step S21, where a second substrate is bonded via surface layer 12f to the initial substrate. In this case, the thermal treatment due to epitaxial growth has to be less than the heating process to induce the splitting at the plane of weakness 12w. Epitaxial growth may also be performed on the exposed layer after step S22 of separation at the plane of weakness, or after step S24 of separation by irradiation absorption. Also, and not shown in FIG. 5, functionalization may be formed in region 12f, corresponding to layer 100, so as to form regions with photovoltaic, optical, optoelectronic, electronic and/or mechanical functions therein or thereon.

In a final step S25 of the exemplary process of FIG. 5B, the bonding layer 23, which previously linked the III-N material layer 12f with the absorbing layer 24, may be removed. If the bonding layer 23 is comprised of silicon dioxide, this layer may appropriately be removed by dry etching or mechanical polishing associated with chemical etching, for example, using a dilute aqueous solution (10% by weight) of hydrofluoric acid (HF). In step S25, the intermediate layer 15 is also removed by chemical etching with a dilute aqueous solution (10% by weight) of hydrofluoric acid (HF) in order to recycle the support substrate 25 for subsequent uses. Indeed, the bonding surface of the support substrate 25 recovers a surface topology and roughness similar to the initial ones. The support substrate 25 has not suffered any degradation of material and does not need further preparation steps such as polishing or removal of material before being reused in the process. For example, for a bonding surface of the support substrate 25 that has initially no surface topology and an initial roughness of about 1 Å RMS (Root Mean Square) measured on 1 micrometer×1 micrometer by AFM (Atomic Force Microscope), the recovered bonding surface of the support substrate roughness after removal of the intermediate layer 15 is of about 1 Å RMS measured on 1 micrometer×1 micrometer by AFM. No topology surface is formed that allows new molecular bonding without needed any further preparation steps.

III-N materials, such as III-N materials grown on a template such as sapphire showing a c-plane wurtzite structure, have a gallium and a nitrogen face. The upper face is usually the gallium face, while the bottom surface (adjacent to the growth substrate), the initial donor support substrate, is a nitrogen face.

With a process according to the above-described first preferred embodiment of the invention as applied to III-N materials, a double transfer is carried out in order to expose in the final product the gallium face, i.e., the same which was initially exposed in the initial product. It is consequently possible to begin epitaxy again at this stage on the transferred thin layer of III-N material. In the present invention, wafers of any particular diameter may be manipulated, without any specific limitation.

In an advantageous embodiment, in the process according to the invention, after the step carrying out irradiation of the electromagnetic radiation absorbing layer 24 through the support substrate 25 and the intermediate layer 15 to induce separation of the support substrate 25 from the initial substrate 10, epitaxy or further functionalization may be carried out on the bonding face 10b of the initial substrate 10 liberated by the irradiation of electromagnetic radiation absorbing layer 24 after irradiating.

In a second preferred embodiment according to the present invention, the structure that can be used in the process of the invention is obtained by ion implantation in a substrate such as bulk GaN, followed by epitaxy of a III-N material such as InGaN in such a way as to not exceed the energy input required to split the substrate along the plane of weakness generated by ion implantation, followed by bonding the GaN/InGaN material to an absorbing layer on an intermediary substrate and then carrying out fracture along the plane of weakness (analogous to step S23 in FIG. 5B). It is also possible to perform implantation after the epitaxy of the InGaN layer and before covering by a protection layer, so that epitaxy thermal budget is not limited. In order to ensure successful fracture about the plane of weakness, it is preferable to first bond the implanted III-N material to an intermediate support, as shown in step S21 of FIG. 5A in relation to the second embodiment, which rigidifies and strengthens the stacked entity. The present second embodiment is of interest in order to be able to continue epitaxy with InGaN, this being of interest in LED applications, for example.

As an example, a layer of InGaN may be grown by epitaxy on a GaNOS substrate and then ion implantation may be carried out in the InGaN. The exposed upper face in the InGaN layer, which has gallium polarity, is bonded to an intermediate substrate having a bonding layer and an absorbing layer. After splitting at the zone of weakness created by ion implantation, the structure consisting of the sacrificial intermediate support, the UV and/or visible light absorbing layer, the bonding layer and the InGaN layer, can be bonded to a final support substrate (see step S23 of FIG. 5B), which may, for example, be a sapphire substrate. Separation can then be carried out using irradiation via the support substrate of the intermediate substrate, and an InGaNOS substrate is obtained with the required polarity on the upper face in order to begin proceed with further epitaxy.

In some advantageous embodiments of the present invention, as mentioned previously, bonding between the initial substrate and the second substrate may be carried out using one or more silicon oxide bonding layers.

In an advantageous embodiment, rather than the electromagnetic radiation absorbing layer being a fully distinct layer extending across the length and breadth of the stacked entity being prepared (such that the cross-section throughout is as shown in the attached Figures), one or more of the bonding layer(s), such as oxide bonding layer(s), may contain at least one embedded region of electromagnetic radiation absorbing material comprising $Si_xN_y$, $Si_xN_y$:H, $Si_3$-$N_4$, GaN, AlN, InN, or mixed nitrides of one or more of In, Ga and Al.

Figure 6A:
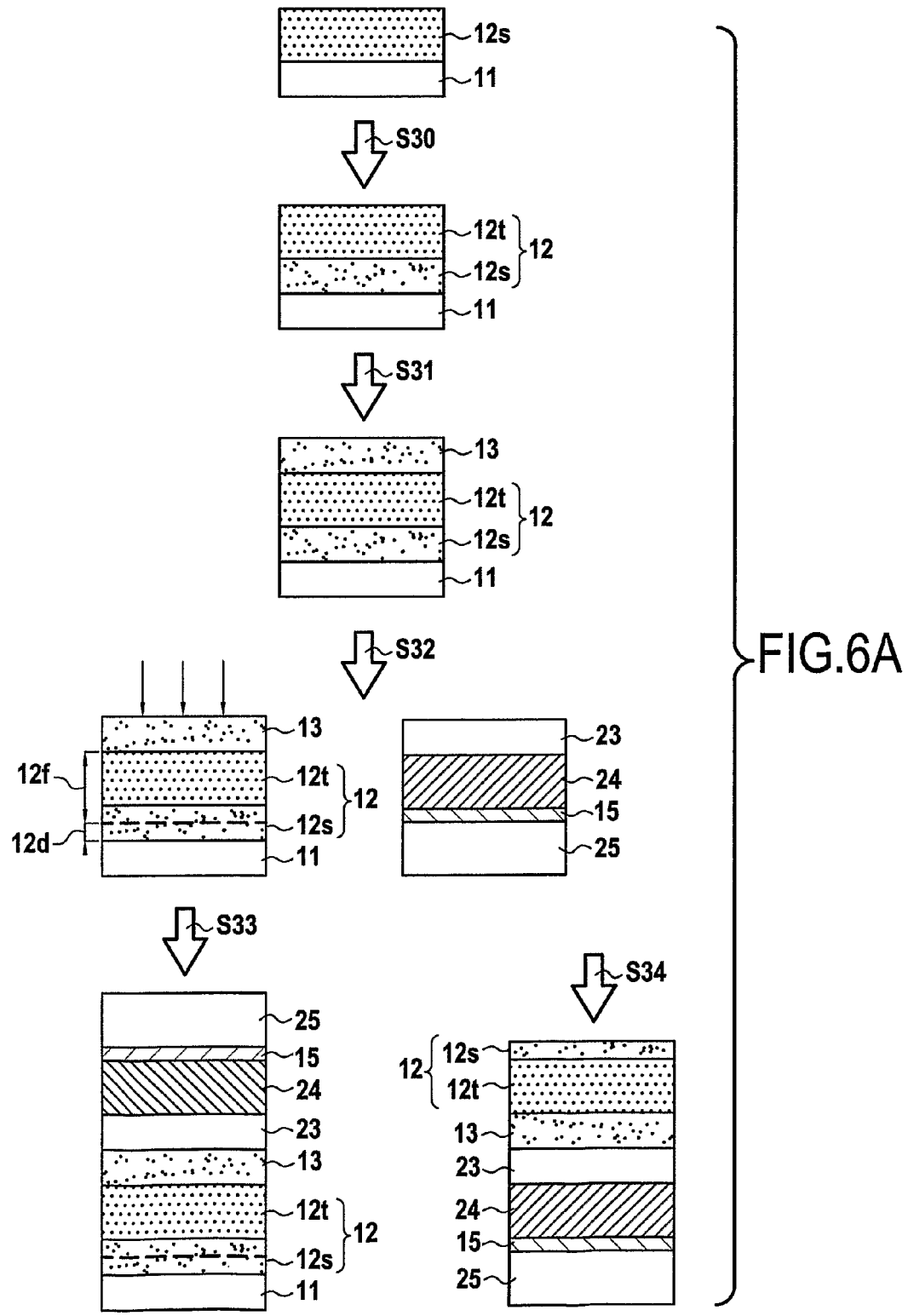
FIGS. 6A and 6B are schematic views of a further example process of the invention in which ion implantation is used as well as bonding to a final substrate.
Figure 6B:
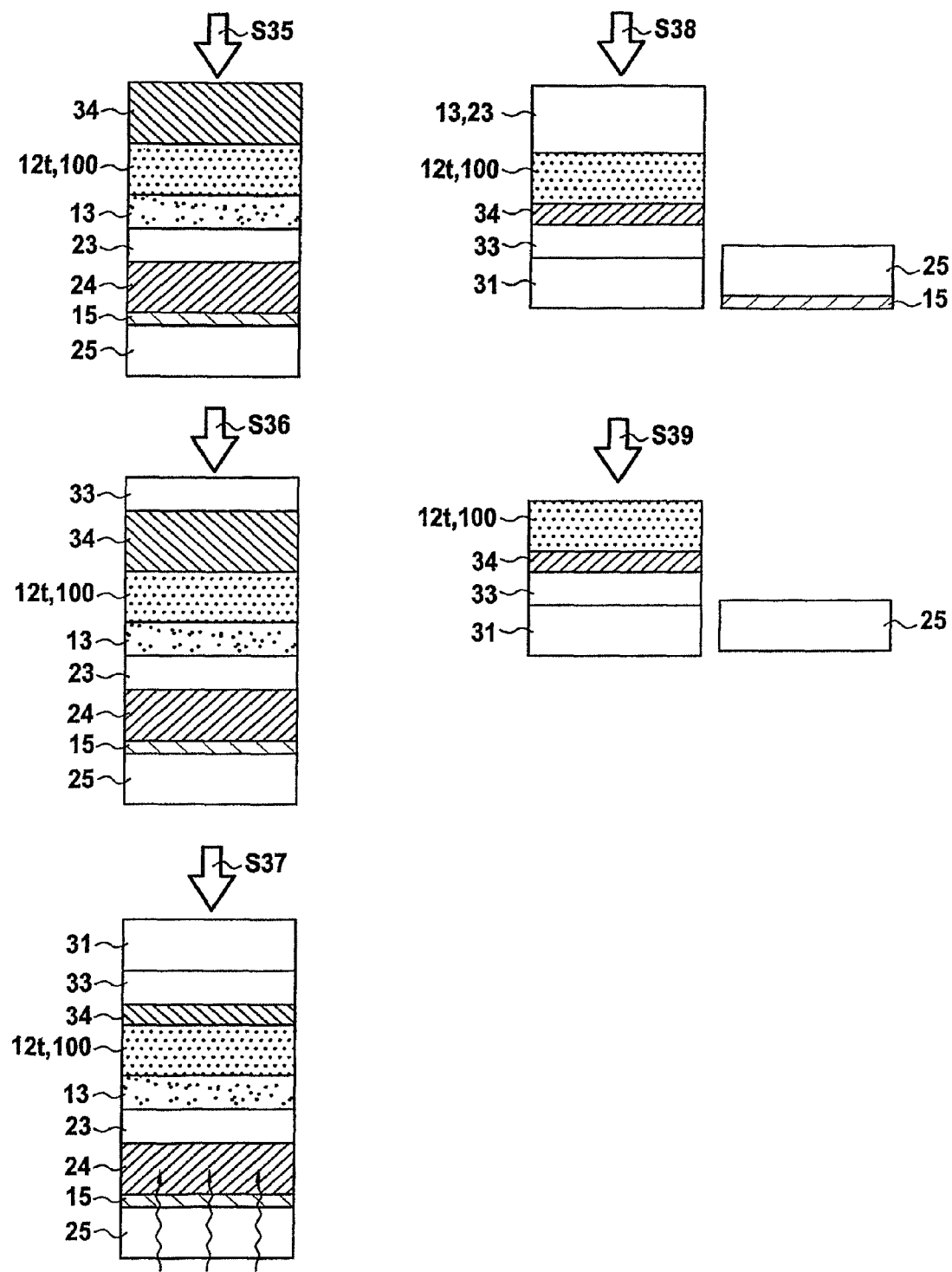

In a third advantageous example embodiment according to the present invention, represented schematically in FIG. 6A and 6B, an InGaN layer is transferred using a process of molecular bonding and released by irradiation of an electromagnetic radiation absorbing layer according to the invention. An initial substrate is provided in which a layer of InGaN 12t to be transferred is formed by epitaxy on a template showing a seed layer of GaN 12s grown by epitaxy on, as an example, a sapphire support substrate 11. This is shown as step S30 in FIG. 6A, where the InGaN layer 12t on GaN layer 12s is together represented as layer 12, and the underlying support substrate 11 is sapphire. In an appropriate approach for performing the invention, the thickness of the layer of InGaN will be approximately 100 nm and the amount of indium will be of the order of 5% to 15%. The dislocation density in the layer will preferably be below $5 \times 10^8/cm^2$. GaN grown by epitaxy on a c-plane sapphire is a polar material and the upper free face is a gallium (Ga) face. This polarity is conserved by the InGaN that is grown thereupon.

In subsequent step S31, an oxide bonding layer ($SiO_2$, layer 13 in the FIG. 6A) is laid down on the InGaN layer 12t by a LPCVD technique. An appropriate thickness will be about 300 nm.

In subsequent step S32, implantation by ions such as hydrogen and/or helium can be carried out through the oxide layer 13 and through the InGaN, in order to create a zone of weakness at a depth 12d of about 500 nm, the zone of weakness being situated in the GaN seed layer. A dose of the order of $4 \times 10^{17}$ atoms/cm$^2$ is appropriate for such an implantation.

In subsequent step S33, an intermediate substrate comprising, in order, a support substrate such as sapphire 25, an intermediate layer 15 according to the invention, an absorbing layer 24 such as $Si_xN_y$ laid down by a PECVD technique with a thickness of about 100 nm, and a silicon dioxide bonding layer 23 having a thickness of about 500 nm is provided. Molecular bonding is used to link the initial and intermediate substrate entities via the oxide bonding layers 13 and 23 that are brought into contact.

Heat treatment then enables, in step S34, fracture of the entity created, removing the initial underlying initial support substrate 11 and a part of the GaN seed layer. Etching techniques known to a skilled person are then used to remove the residual GaN (between steps S34 and S35, and not shown in FIGS. 6A and 6B), and this exposes the face of the InGaN layer 12t or 100 having N polarity. In subsequent step S35, a layer of $Si_xN_y$ is laid down by a PECVD technique to a thickness of approximately 50 nm. This further electromagnetic radiation absorbing layer and/or adhesion layer is represented as layer 34 in FIG. 6B. A silicon dioxide bonding layer is then laid down by an LPCVD or PECVD technique with a thickness of approximately 500 nm to 3 µm (step S36, the silicon dioxide layer is represented as 33). After preparation of the surfaces for bonding (planarization, CMP, brushing, and optionally plasma activation), the structure obtained in step S36 is put into contact with the final support substrate of sapphire, labeled 31 (step S37). Bonding reinforcement thermal treatment may be carried out, involving heating at 300° C. to 950° C. during several hours.

Subsequently, in step S38, electromagnetic radiation absorbing layer 24 may be irradiated, for instance, by sweeping a laser beam at the surface of the intermediate support substrate 25, at a wavelength of 193 nm in order to induce decomposition and separation of the intermediate support (intermediate support substrate 25 and intermediate layer 15 in combination with absorbing layer 24), possibly with the addition of mechanical energy.

Subsequent removal of possible absorbing layer 24 residue and of the oxide bonding layers 13 and 23 is carried out in step 39, for example, by dry etching or mechanical polishing associated with contact with diluted hydrofluoric acid, then enables the InGaN surface 12t or 100 having Ga polarity to be exposed. This may then be used as a basis for further epitaxy of InGaN and/or other active layers. The absorbing layer 34 may be used as a separation layer for separation of the final support substrate 31 in a subsequent use of the final entity if needed. In step S39, the intermediate layer 15 is also removed in order to recycle the support substrate 31 for subsequent uses.

What is claimed is:

1. A process for recycling a support substrate made of a material that is substantially transparent to at least one wavelength of electromagnetic radiation, which process comprises:

provoding an initial substrate;

forming an intermediate layer on a bonding face of a support substrate having an initial roughness, with the intermediate layer being made of a material that is transparent to at least one wavelength of electromagnetic radiation;

forming an electromagnetic radiation absorbing layer on one of a bonding face of the initial substrate or the intermediate layer;

bonding the initial substrate and the support substrate with the electromagnetic radiation absorbing layer positioned therebetween;

irradiating the electromagnetic radiation absorbing layer through the support substrate and the intermediate layer to induce separation of the support substrate from the initial substrate;

removing the intermediate layer after the support substrate is separated so as to recover the support substrate for recycling and reuse, wherein the bonding face of the recovered support substrate has a roughness similar to the initial roughness; and reusing the recovered support substrate in a subsequent bonding process without reducing the roughness of the bonding face of the recovered support substrate.

2. The process according to claim 1, wherein the intermediate layer has a thickness of at least 10 nm.

3. The process according to claim 1, wherein the intermediate layer comprises at least one material of $SiO_2$, LiF, $CaF_2$ or $MgF_2$.

4. The process according to claim 3, wherein the intermediate layer is removed by chemical etching or by polishing.

5. The process according to claim 1, wherein the support substrate comprises at least one material of sapphire ($Al_2O_3$), MgO, $CaF_2$, $MgF_2$, $LiTaO_3$ or $LiNbO_3$.

6. The process according to claim 1, wherein the intermediate layer is made of $SiO_2$, the support substrate is made of sapphire ($Al_2O_3$), the bonding face of the support substrate has an initial roughness of about 1 Å RMS measured on 1 micrometer×1 micrometer by AFM, and the roughness of the bonding face of the recovered support substrate is about 1 Å RMS measured on 1 micrometer×1 micrometer by AFM.

7. The process according to claim 4, wherein the support substrate comprises a boron-doped silica glass and the intermediate layer comprises a vitreous material, and the intermediate layer is removed from the recovered support substrate by polishing.

8. The process according to claim 1, which further comprises removing part of the initial substrate to form a layer prior to forming the absorbing layer and bonding of the substrates.

9. The process according to claim 8, which further comprises functionalizing the layer of the initial substrate bonding further layers or substrates to the layer of the initial substrate prior to forming the absorbing layer by forming regions or layers having photovoltaic, optical, optoelectronic, electronic or mechanical functions in or on the layer of the initial substrate.

10. The process according to claim 1, which further comprises forming regions or layers having photovoltaic, optical, optoelectronic, electronic or mechanical functions on the support substrate.

11. The process according to claim 1, wherein the initial substrate is a bulk free-standing structure.

12. The process according to claim 1, wherein the initial substrate comprises a surface layer having a face for bonding to the support substrate, and an underlying support substrate acting as a template on which the surface layer has been deposited.

13. The process according to claim 1, wherein the initial substrate comprises a surface layer, a subjacent intermediate layer and an underlying support substrate.

14. The process according to claim 8, which further comprises performing ion implantation into the initial substrate through the bonding face, prior to bonding to the support substrate, so as to provide a plane of weakness defining an upper region of the initial substrate, and then removing the upper region by splitting at the plane of weakness.

15. The process according to claim 1, wherein the initial substrate comprises at least one material of GaN, InGaN, SiC, Si, Si(000), Si(111), GaAs, ZnO, crystalline AlN, AlGaN, InGaAs, InP, Ge, or InAlAs.

16. The process according to claim 1, wherein the electromagnetic radiation absorbing layer comprises at least one material of $Si_xN_y$, $Si_x$, $N_y$:H, $Si_3N_4$, GaN, AlN, InN, or mixed nitrides of one or more of In, Ga and Al or poly Si, single-crystalline Si, or amorphous silicon containing at least 2 atomic percent of hydrogen.

17. The process according to claim 1, wherein the bonding further comprises providing one or more silicon oxide bonding layers on the initial substrate, the support substrate, or both substrates.

18. The process according to claim 8, which further comprises providing on the face of the removed initial substrate an epitaxial layer or further functionalization.

\* \* \* \* \*

UNITED STATES PATENT AND TRADEMARK OFFICE
CERTIFICATE OF CORRECTION

PATENT NO. : 8,921,239 B2  
APPLICATION NO. : 13/516199  
DATED : December 30, 2014  
INVENTOR(S) : Anne Laure Belle Page 1 of 1

It is certified that error appears in the above-identified patent and that said Letters Patent is hereby corrected as shown below:

On the title page:
In ITEM (56) References Cited
 FOREIGN PATENT DOCUMENTS
 Page 2, 1st column, line 11  change "116003 A2" to --116030 A2--

In the specification:
 COLUMN 6, LINE 14, change "doped SiO2" to --doped $SiO_2$--
 COLUMN 6, LINE 55, change "materiala, namely" to --materials, namely--
 COLUMN 9, LINE 25, change "weakness of between 50 and" to
  --weakness 12$w$ of between 50 nm and--

Signed and Sealed this
Twenty-ninth Day of September, 2015

Michelle K. Lee
*Director of the United States Patent and Trademark Office*